(12) United States Patent
Wilson et al.

(10) Patent No.: US 6,631,254 B1
(45) Date of Patent: Oct. 7, 2003

(54) APPARATUS FOR PRODUCING A RADIO-FREQUENCY SIGNAL

(75) Inventors: Nigel Wilson, Bradford on Avon (GB); Rick A. Hillum, Trowbridge (GB)

(73) Assignee: Securicor Wireless Technology Limited (GB)

( * ) Notice: Subject to any disclaimer, the term of this patent is extended or adjusted under 35 U.S.C. 154(b) by 0 days.

(21) Appl. No.: 09/568,295

(22) Filed: May 9, 2000

(30) Foreign Application Priority Data

May 10, 1999 (GB) ............................................. 9910822

(51) Int. Cl.[7] ........................... H04H 1/02; H04L 27/20
(52) U.S. Cl. ...................... 455/91; 455/108; 455/118; 375/295
(58) Field of Search ................................ 332/144, 145, 332/149, 151, 159, 162; 331/23; 455/118, 91, 108, 119, 126, 333, 127, 103, 110, 112; 375/265, 283, 298, 297, 296, 302, 295; 330/129, 131, 141

(56) References Cited

U.S. PATENT DOCUMENTS

| 4,481,672 | A | | 11/1984 | Watkinson | |
|---|---|---|---|---|---|
| 5,313,173 | A | * | 5/1994 | Lampe | 331/12 |
| 5,369,789 | A | * | 11/1994 | Kosugi et al. | 455/126 |
| 5,420,536 | A | * | 5/1995 | Faulkner et al. | 330/149 |
| 5,430,416 | A | * | 7/1995 | Black et al. | 332/145 |
| 5,507,017 | A | * | 4/1996 | Whitmarsh et al. | 455/126 |
| 5,623,226 | A | * | 4/1997 | Whitmarsh et al. | 330/2 |
| 5,642,384 | A | * | 6/1997 | Ramesh | 375/265 |
| 5,903,611 | A | * | 5/1999 | Schnabl et al. | 375/297 |
| 6,307,894 | B2 | * | 10/2001 | Eidson et al. | 375/297 |
| 6,373,902 | B1 | * | 4/2002 | Park et al. | 375/296 |
| 6,415,002 | B1 | * | 7/2002 | Edwards et al. | 375/261 |

FOREIGN PATENT DOCUMENTS

| WO | WO 98/00908 | 1/1998 |
|---|---|---|
| WO | WO 99/05869 | 2/1999 |

OTHER PUBLICATIONS

European Search Report dated Sep. 2000, 3 pages.
Search Report Under Section 17(5) dated Jul. 30, 1999 (2 pages).

* cited by examiner

Primary Examiner—Dwayne Bost
Assistant Examiner—Kamran Afshar
(74) Attorney, Agent, or Firm—Harness, Dickey & Pierce, P.L.C.

(57) ABSTRACT

A radio frequency amplifier uses an offset phase locked loop to produce a radio frequency signal from a baseband signal. In order to allow the phase locked loop to process the signal as one of constant amplitude, the signal is amplitude limited prior to application to the phase comparator, and envelope restoration is achieved by envelope-modulating the output in the RF power amplifier stage.

8 Claims, 3 Drawing Sheets

APPARATUS FOR PRODUCING A RADIO-FREQUENCY SIGNAL

The present invention relates to apparatus for producing a radio frequency signal with non-constant envelope modulation.

So-called "Cartesian" amplifiers have been used in radio equipment for use, for example, in mobile radio systems. In a Cartesian amplifier, a base band signal resolved into I and Q quadrature components which are processed separately for modulation purposes and recombined just prior to application to the radio frequency amplifier. These amplifiers are subject to two limitations, namely they are capable of handling only a relatively narrow bandwidth at baseband (e.g. up to 25 KHz), and there is a noise floor which it is not possible to remove due to the action of the feedback loop and the use of a vector modulator.

The present invention seeks to provide an apparatus which can produce a non-constant-envelope radio frequency output signal with a transmission bandwidth greater than a Cartesian amplifier, e.g. of the order of a few hundred kiloherz, and which is capable of low noise performance.

According to the present invention there is provided an apparatus for producing a non-constant-envelope radio frequency signal comprising:

a) an input for a baseband signal;
b) means for generating from the baseband signal a modulated radio frequency signal of substantially constant envelope amplitude and suitable for radio-frequency amplification to a level for broadcasting;
c) means for envelope-modulating and outputting the amplified radio-frequency modulated signal so as to have a required non-constant envelope;

wherein the generating means b) comprises i) a frequency-offset phase locked loop including a frequency-controllable oscillator which produces as its output said modulated radio frequency signal of substantially constant envelope amplitude and ii) a phase comparator, the output of the phase comparator being a signal representing the phase difference between a constant-envelope-amplitude signal derived from the output of means c) and a constant-envelope signal derived from the baseband signal.

The invention will be further described by way of non-limitative example with reference to the accompanying drawings in which.

Figure 1:
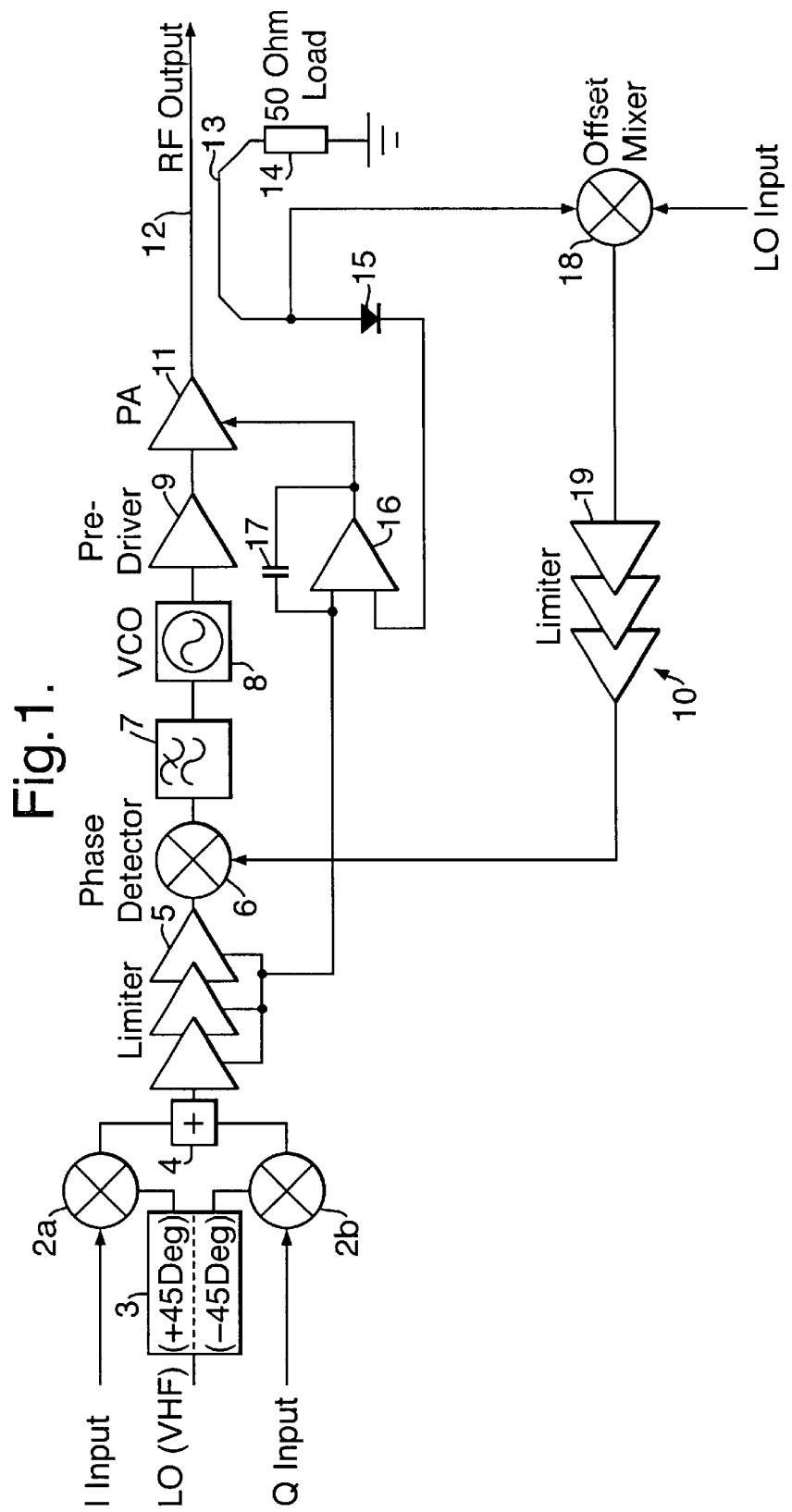
FIG. 1 is a block circuit diagram of one embodiment of the present invention.

The apparatus shown in the FIG. 1 is for modulating an RF signal for broadcast with a baseband signal in which is encoded digital data which it is desired to transmit, and for amplifying the RF signal to a level suitable for broadcast. However, it should be emphasised that the invention is not restricted to use with digital data signals, but can be used with voice and other audio signals as well as other types of signal entirely. The illustrated apparatus is intended for use with a baseband signal with any bandwidth up to the order of a few hundred kiloherz and to produce a modulated RF signal at a frequency, say, of 400 MHz with a non-constant envelope. The frequency of use of this invention is not restricted and could be almost any RF frequency e.g. 108–138 MHz, 390–420 MHz, 1.8 GHz, 3.5 GHz, 5 GHz, etc.

As will become apparent from the following, the circuit operates in the manner of an Offset Phase Locked Loop (OPLL) modulator. Ordinarily, OPLL modulators can not be used with non-constant-envelope modulation scheme because they provide no means to control the amplitude of the modulated signal.

Figure 2A:
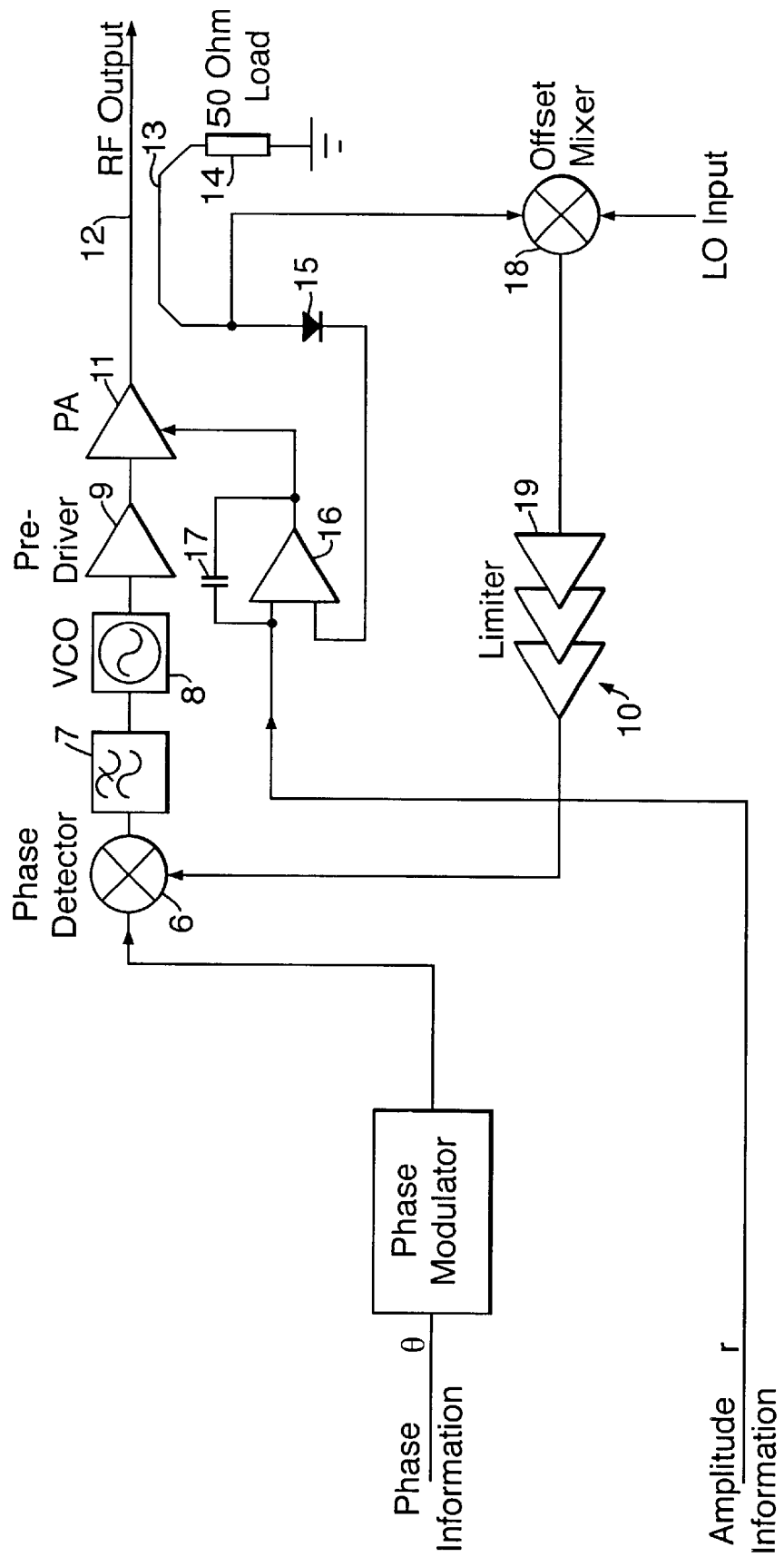
FIG. 2a is a block circuit diagram of a first variant of the embodiment of FIG. 1.
Figure 2B:
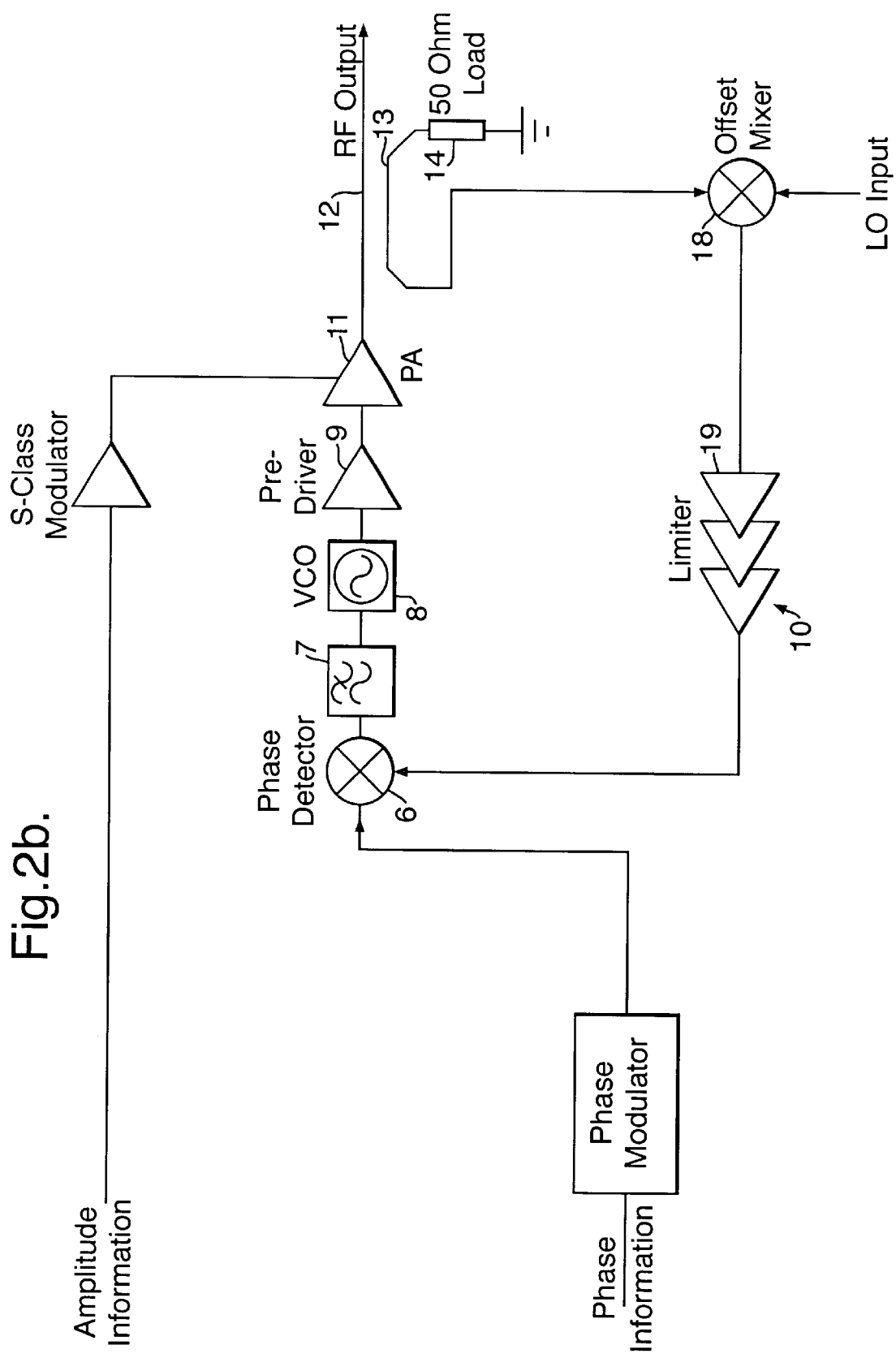
FIG. 2b is a block circuit diagram of a second variant of the embodiment of FIG. 1.

For the purposes of explanation, prior to application to the circuit shown in FIG. 1, the baseband digitally encoded signal is assumed to have been resolved into I and Q quadrature components by a resolver (not shown). However the invention is not restricted to that arrangement: firstly, the baseband signal can be generated ab initio in quadrature form (and hence not require resolving into it); and, secondly, the baseband signal need not be in quadrature form at all (though this could require other, additional, processing of the signal in order to meet regulatory and/or other requirements with regard to bandwidth, out-of-band noise and so forth). It should be noted that the invention is not restricted to using baseband signal in I/Q format; FIGS. 2a and 2b illustrates a variant where the I/Q format is not used.

Given a desired nominal transmission frequency FT of, say 400 MHz, the apparatus requires a local oscillator to provide two related frequencies F1 and F2. By way of example, F1 is conveniently 90 MHz, which requires F2 to be either 410 MHz or 310 MHz depending on the implementation of the feedback loop of the OPLL.

The I and Q quadrature components of the baseband signal are applied to respective inputs 1a and 1b where they passed to mixers 2a and 2b which mix them with +45° and −45° phase-shifted components of the reference signal of frequency F1, which are provided by the pair of outputs of a phase splitter 3 to which this reference signal is applied. 0 and −90° could be used as an alternative to +45° and −45°, as could any other combination with the appropriate 90° phase difference.

The outputs of the mixers 2a and 2b, which contain components at the sums and differences of the baseband signal and F1 are summed by an adder 4 and applied to the input of a multi-stage limiter 5. This limiter produces an output signal of substantially constant envelope amplitude which is applied to one input of a phase comparator 6 which constitutes part of the OPLL. Additionally, the limiter 5 produces, at output 5A a signal which represents the envelope of the signal applied to the input of the limiter.

The phase comparator 6 produces an output signal whose amplitude is proportional to the difference between the signals applied to its two inputs, one of these being the output of the limiter 5 as just described. The other input of phase comparator 6 receives a signal fed back through a feedback path generally designated 10 around the output stage of the apparatus.

The output of phase comparator 6 is applied to the input of a low pass filter 7 whose frequency characteristics are chosen such that its output is restricted to baseband frequencies. This output is applied to the frequency-control input of a controlled oscillator 8, preferably a voltage controlled oscillator which is configured for operation at a frequency centred on the nominal transmission frequency (e.g. 400 MHz) and thus produces an output, of constant envelope amplitude, of a frequency whose value depends on the OPLL phase error as represented by the output of low pass filter 7.

The RF frequency-modulated signal of oscillator 8 is passed via a driver pre-amplifier 9 to an RF power amplifier 11 which amplifies the signal to a level suitable for feeding to an aerial for broadcasting.

A directional coupler 13 loaded by a 50-ohm load 14 picks off part of the output of the RF power amplifier 11. In order to complete the "loop" of the OPLL, this signal, which is simply the broadcast RF signal scaled down in amplitude, is fed to one input of a mixer 18. The other input of mixer 18 receives a local reference signal from the aforementioned local reference oscillator at a frequency (F2) of F1+FT, or FT F1−F1, but in either event such that the output of the mixer 18 is at the frequency F1, the purpose being to derive a signal which can be applied to the second input of phase comparator 6, so completing the phase-control loop. This output from mixer 18 is applied to a multi-stage limiter 19 whose characteristics are matched (in terms of amplitude-limiting effect and frequency response) to the limiter 5, subject of course to any amplitude scaling required to make the signals at the two inputs of phase comparator correctly comparable.

The signal picked-off from the directional coupler 13 is also rectified by a diode 15 and applied to one input of a differential amplifier 16 which operates as an integrator and controls the gain (and hence the output envelope) of the RF power amplifier 11. The other input of differential amplifier 16 receives the envelope-representing signal described above from the output 5A of the limiter 5.

Thus the effect of the differential amplifier 16 is to reinstate or "restore" the non-constant envelope modulation which is present in the signal at the input of limiter and which is removed from the signal as it is passed to the OPLL portion of the circuit The key advantage of the use of the OPLL arrangement is that it allows the transmission of complex constant envelope schemes, such as GMSK, with very low noise compared to the use of a simple vector modulator, because OPLL applies modulation to a VCO as part of a control loop so the only noise generated by the modulator is the phase noise of the VCO. Modulators that do not use a OPLL typically use an I/Q vector modulator. In such a transmitter a VCO, as part of a Phase Locked Loop will contribute only part of the transmitter's noise, other components coming from the mixers in the vector modulator, thermal noise amplified from baseband if the signal to noise ratio of the input signal is insufficient and noise from a frequency up-converter that may be used after the vector modulator. Typically these contributions are significantly larger than that of the VCO. It will be appreciated that the above illustrated embodiment shares the low noise characteristics of prior OPLLs, while the envelope restoration enables this to be achieved in the context of a non-constant-envelope modulation scheme.

Advantages of the illustrated embodiment include:

very low wide-band noise (approximately equal to that of the VCO, say—150 dBc/Hz to 160 dBc/Hz)

the transmitter operates linearly independent of modulation envelope it provides an easily integrated circuit implementation it avoids external filters to reduce wideband noise it avoids the linearity vs noise compromises of a Cartesian loop.

Numerous variations of the illustrated embodiment, within the scope of the appended claims, will be apparent to those skilled in the art. In particular, it is not necessary to use a closed loop arrangement for achieving the restoration of the signal envelope at the power amplification stage: rather, it could be achieve by open loop control, either on the basis of an envelope-representing control signal derived from the input signal, as in the embodiment illustrated above (FIG. 1) or a signal inputted to the apparatus and representing the required envelope modulation of the RF output (see FIGS. 2a and 2b). In addition the amplitude of control of the PA can be achieved using gain control (via bias circuitry or other method) or amplitude control of supply voltages (as in conventional AM transmitters) or any other appropriate method.

In the variant shown in FIG. 2a, the inputs are presented to the circuit as an amplitude information signal r and a phase information signal θ, rather than as I & Q quadrature signals. Items 2a to 5 of FIG. 1 are thus omitted and instead the amplitude information signal R is applied to one input of integrator 16, while the phase information signal θ is applied via a phase modulator 21 to the phase detector 6. The variant shown in FIG. 2b is similar to that of FIG. 2a, but uses open-loop, instead of closed-loop, envelope modulation. Thus items 16–18 of FIG. 1 are also omitted and instead the amplitude information signal r is applied to an S-class modulator to control the envelope of the output of the power amplifier 11. S-class modulation can be achieved by variation of the power amplifier power supply voltage, e.g. by variable duty-cycle switching.

What is claimed is:

1. Apparatus for producing a non-constant-envelope radio frequency signal comprising:

a) an input for a baseband signal;

b) means for generating from the baseband signal a modulated radio frequency signal of substantially constant envelope amplitude and suitable for radio-frequency amplification to a level for broadcasting;

c) means for envelope-modulating and outputting the amplified radio-frequency modulated signal so as to have a required non-constant envelope;

wherein the generating means b) comprises i) a frequency-offset phase locked loop including a frequency-controllable oscillator which produces as its output said modulated radio frequency signal of substantially constant envelope amplitude and ii) a phase comparator, the output of the phase comparator being a signal representing the phase difference between a constant-envelope-amplitude signal derived from the output of means c) and a constant-envelope signal derived from the baseband signal.

2. Apparatus according to claim 1, and including means for feeding back the amplified radio-frequency modulated signal (FT) to a first mixer where it is mixed with a signal of a first reference frequency (F2), the frequency being chosen such that the output of the controlled oscillator is at the required radio frequency (F1).

3. Apparatus according to claim 2 including a second mixer for mixing the baseband signal with a signal of a second reference frequency lower than the first frequency.

4. Apparatus according to claim 1, wherein the input is for a baseband signal in I and Q quadrature format.

5. Apparatus according to claim 4, wherein the second mixer is operative to mix the I and Q quadrature components of the baseband signal with respective ones of two signals which are at the second reference frequency and are phase shifted 90 degrees relative to one another.

6. Apparatus according to claim 5, wherein a pair of amplitude limiters are provided to render the two mixed signals of substantially constant amplitude.

7. Apparatus according to claim 1, wherein the envelope modulating means is operative to derive a control signal to control the envelope of the radio-frequency signal in accordance between the difference between that envelope and the envelope of a signal derived from the baseband signal.

8. Apparatus according to claims 2 and 7, wherein said derived signal is the signal resulting from mixing the baseband signal with the second reference signal.

* * * * *